United States Patent
Hsu et al.

(10) Patent No.: US 11,424,407 B2
(45) Date of Patent: Aug. 23, 2022

(54) RESISTIVE RANDOM ACCESS MEMORY AND METHOD OF MANUFACTURING THE SAME

(71) Applicant: Winbond Electronics Corp., Taichung (TW)

(72) Inventors: Po-Yen Hsu, New Taipei (TW); Bo-Lun Wu, Tianzhong Township, Changhua County (TW); Tse-Mian Kuo, New Taipei (TW)

(73) Assignee: WINBOND ELECTRONICS CORP., Taichung (TW)

( * ) Notice: Subject to any disclaimer, the term of this patent is extended or adjusted under 35 U.S.C. 154(b) by 98 days.

(21) Appl. No.: 17/010,435

(22) Filed: Sep. 2, 2020

(65) Prior Publication Data
US 2022/0069210 A1    Mar. 3, 2022

(51) Int. Cl.
*H01L 45/00* (2006.01)
*H01L 27/24* (2006.01)

(52) U.S. Cl.
CPC ...... *H01L 45/1233* (2013.01); *H01L 27/2463* (2013.01); *H01L 45/08* (2013.01); *H01L 45/1253* (2013.01); *H01L 45/146* (2013.01); *H01L 45/1675* (2013.01)

(58) Field of Classification Search
CPC . H01L 45/1233; H01L 27/2463; H01L 45/08; H01L 45/1253
See application file for complete search history.

(56) References Cited

U.S. PATENT DOCUMENTS

| | | | |
|---|---|---|---|
| 2004/0245557 A1* | 12/2004 | Seo | H01L 27/2409 257/298 |
| 2017/0125673 A1* | 5/2017 | Hsu | H01L 45/12 |
| 2018/0331288 A1 | 11/2018 | Pillarisetty | |
| 2020/0106013 A1* | 4/2020 | Strutt | H01L 45/146 |

FOREIGN PATENT DOCUMENTS

| | | |
|---|---|---|
| CN | 104425716 A | 3/2015 |
| KR | 20130066288 A | 6/2013 |
| TW | 201521094 A | 6/2015 |
| TW | 201715764 A | 5/2017 |
| TW | 201911315 A | 3/2019 |

\* cited by examiner

*Primary Examiner* — Shih Tsun A Chou
(74) *Attorney, Agent, or Firm* — Muncy, Geissler, Olds & Lowe, P.C.

(57) ABSTRACT

A resistive random access memory is provided. The resistive random access memory includes a substrate, a first dielectric layer, a bottom electrode, a resistance switching layer, an oxygen exchange layer, a barrier layer and a top electrode. The first dielectric layer is disposed on the substrate. The bottom electrode is disposed on the first dielectric layer. The resistance switching layer is disposed on the bottom electrode. The oxygen exchange layer is disposed on the resistance switching layer. A contact area between the oxygen exchange layer and the resistance switching layer is smaller than a top surface area of the resistance switching layer. The barrier layer is disposed on the oxygen exchange layer. The top electrode is disposed on the barrier layer.

14 Claims, 3 Drawing Sheets

RESISTIVE RANDOM ACCESS MEMORY AND METHOD OF MANUFACTURING THE SAME

TECHNICAL FIELD

The present disclosure relates to a memory, and, in particular, to a resistive random access memory and a method of manufacturing the same.

BACKGROUND

Resistive random access memory (RRAM) has many advantages, such as low power consumption, low operating voltage, short writing and erasing time, long durability, long data retention time, non-destructive read, multi-state, simple manufacturing, and expandable memory. Thus, resistive random access memory has become the norm for non-volatile memory. A basic structure of resistive random access memory includes a metal-insulator-metal (MIM) structure formed by stacking a bottom electrode, a resistance switching layer, and a top electrode.

A switching mechanism of the resistive random access memory is forming conductive filaments by oxygen vacancies or movement of oxygen atoms in the resistance switching layer or the oxygen exchange layer.

When a positive setting voltage is applied to the resistive random access memory, the oxygen atoms in the resistance switching layer move to the oxygen exchange layer, in order to form conductive filaments and change from a high resistance state into a low resistance state. This process is called "SET" operation. When a reverse resetting voltage is applied to the resistive random access memory, the oxygen atoms in the oxygen exchange layer move to the resistance switching layer for disconnecting the conductive filaments in the resistance switching layer, in order to change from the low resistance state into the high resistance state. This process is called "RESET" operation. Through a different polarity of the applied voltage to control the resistance level, so as to achieve the purpose of storing data.

Although ordinary resistive random access memories may roughly meet their original intended use, the ordinary resistive random access memories have not fully met the requirements in all aspects yet. For example, every time the memory is switched to the high resistance state, the oxygen atoms in the oxygen exchange layer may not fill the oxygen vacancies in the resistance switching layer, resulting in a large variability in the operating voltage of the memory and poor device stability. Therefore, there is still a need for a novel resistive random access memory to solve the above problems.

SUMMARY

A resistive random access memory and a method of manufacturing the same are provided, which can effectively increase the exchange efficiency of oxygen atoms and increase the device stability.

According to some embodiment of the disclosure, a resistive random access memory is provided. The resistive random access memory includes a substrate, a first dielectric layer, a bottom electrode, a resistance switching layer, an oxygen exchange layer, a barrier layer and a top electrode. The first dielectric layer is disposed on the substrate. The bottom electrode is disposed on the first dielectric layer. The resistance switching layer is disposed on the bottom electrode. The oxygen exchange layer is disposed on the resistance switching layer. A contact area between the oxygen exchange layer and the resistance switching layer is smaller than a top surface area of the resistance switching layer. The barrier layer is disposed on the oxygen exchange layer. The top electrode is disposed on the barrier layer.

According to some embodiment of the disclosure, a method for manufacturing a resistive random access memory is provided. A substrate is provided. A first dielectric layer is formed on the substrate. A bottom electrode is formed on the first dielectric layer. A resistance switching layer is formed on the bottom electrode. An oxygen exchange layer is formed on the resistance switching layer, wherein a contact area between the oxygen exchange layer and the resistance switching layer is smaller than a top surface area of the resistance switching layer. A barrier layer is formed on the oxygen exchange layer. A top electrode is formed on the barrier layer.

BRIEF DESCRIPTION OF THE DRAWINGS

In order to make features and advantages of the embodiments of the present disclosure more obvious and understandable, some embodiments are specifically listed below, and are described in detail with the accompanying drawings as follows.

DETAILED DESCRIPTION

Figure 1:
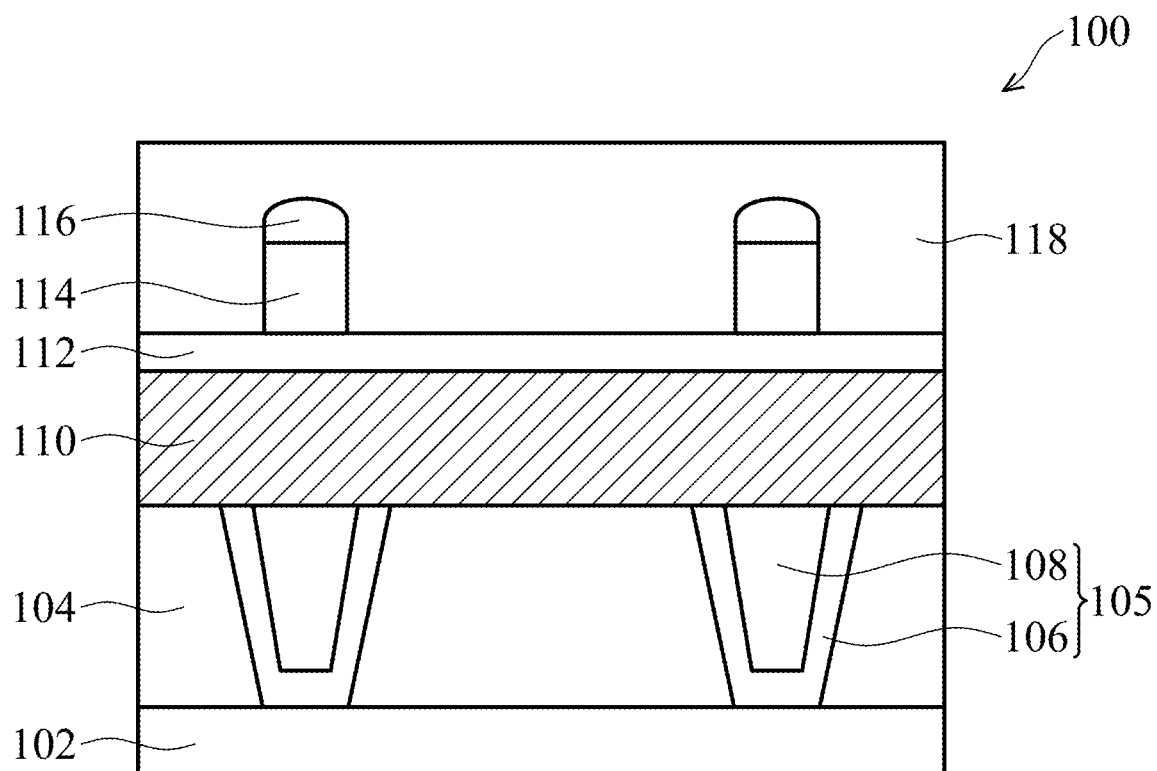
FIGS. 1 to 6 are schematic cross-sectional views illustrating the resistive random access memory formed in each stage according to some embodiments of the disclosure.

The present disclosure is described more fully with reference to the accompanying drawings of those embodiments. However, the present disclosure can also be embodied in various different aspects and should not be limited to those embodiments described herein. The thickness of a layer and a region in the accompanying drawings may be exaggerated for clarity. The same or similar reference numerals indicate the same or similar elements, and will not be repeated in the following content.

FIGS. 1 to 6 are schematic cross-sectional views illustrating the resistive random access memory 100 formed in each stage according to some embodiments of the disclosure. Referring to FIG. 1, a substrate 102 is provided. The substrate 102 may be a semiconductor substrate. The above mentioned semiconductor substrate may be an elemental semiconductor including silicon or germanium; a compound semiconductor including gallium nitride, silicon carbide, gallium arsenide, gallium phosphide, indium phosphide, indium arsenide and/or indium antimonide; an alloy semiconductor including silicon germanium alloy, gallium arsenide phosphide alloy, aluminum indium arsenic alloy, aluminum gallium arsenide alloy, indium gallium arsenide alloy, indium gallium phosphide alloy and/or indium gallium arsenide phosphide alloy, or a combination thereof. In some embodiments, the substrate 102 may be a single crystal substrate, a multi-layer substrate, a gradient substrate, other suitable substrates, or a combination thereof. In addition, the substrate 102 may also be a silicon-on-insulator substrate. The silicon-on-insulator substrate may include a base substrate, a buried oxide layer disposed on the base substrate, and a semiconductor layer disposed on the buried oxide layer. In addition, the substrate 102 may be formed to have active elements and/or passive elements and interconnection structures (for example, conductive layers, contacts, or the like). The active elements may include transistors, diodes, or the like, while the passive components may include resistors, capacitors, inductors, or the like.

Next, as shown in FIG. 1, a dielectric layer 104 is formed on the substrate 102 by a chemical vapor deposition (CVD) process, an atomic layer deposition (ALD) process, a physical vapor deposition (PVD) process, a molecular beam deposition (MBD) process, plasma enhanced chemical vapor deposition (PECVD) or other suitable deposition process or a combination thereof. In some embodiments, the dielectric layer 104 may be oxide (for example, silicon oxide, silicon dioxide), nitride, low-k dielectric material (for example, material with a lower dielectric constant than silicon dioxide), silicon oxynitride, phosphosilicate glass, borosilicate glass, borophosphosilicate glass, undoped silicate glass, fluorine-doped silicate glass, organosilicate glass, $SiO_xC_y$, silicon carbide materials or a combination thereof. In some embodiments, a thickness of the dielectric layer 104 is between 300 nm and 400 nm. In addition, a conductive structure 105 is formed in the dielectric layer 104 for connecting the resistive random access memory to the active elements and/or the interconnect structure in the substrate 102.

In some embodiments, the conductive structure 105 includes a liner layer 106 and a conductive material 108. The liner layer 106 may be made of conductive materials, such as tungsten nitride, titanium nitride, tantalum nitride, or a combination thereof. The conductive material 108 may include amorphous silicon, polysilicon, metal, metal nitride, conductive metal oxide, or a combination thereof. For example, the conductive material 108 may include tungsten, copper, tungsten nitride, ruthenium, silver, gold, rhodium, molybdenum, nickel, cobalt, cadmium, zinc, or alloys thereof or a combination thereof.

Next, a bottom electrode 110 is formed on the dielectric layer 104. The method of forming the bottom electrode 110 may include CVD, ALD, PVD, MBD, PECVD, another suitable deposition process, or a combination thereof. In some embodiments, the bottom electrode 110 is made of a conductive material, such as amorphous silicon, polysilicon, metal, metal nitride, conductive metal oxide, or a combination thereof. For example, the bottom electrode 110 may be made of tungsten, copper, tungsten nitride, ruthenium, silver, gold, rhodium, molybdenum, nickel, cobalt, cadmium, zinc, an alloy thereof, or a combination thereof. In some embodiments, a thickness of the bottom electrode 110 is between 25 nm and 35 nm.

Then, a resistance switching layer 112 is formed on the bottom electrode 110. The method of forming the resistance switching layer 112 may include CVD, ALD, PVD, MBD, PECVD, another suitable deposition process, or a combination thereof. In some embodiments, the resistance switching layer 112 is made of a transition metal oxide, such as hafnium oxide, titanium oxide, tungsten oxide, tantalum oxide, zirconium oxide, or a combination thereof. In some embodiments, a thickness of the resistance switching layer 112 is between 3 nm and 10 nm.

An oxygen exchange layer 114 is formed on the resistance switching layer 112. The method for forming the oxygen exchange layer 114 may include CVD, ALD, PVD, MBD, PECVD, another suitable deposition process, or a combination thereof. In some embodiments, the oxygen exchange layer 114 is made of aluminum, titanium, hafnium, tantalum, iridium, or a combination thereof.

Next, a hard mask 116 is formed on the oxygen exchange layer 114. The method of forming the hard mask 116 may include CVD, ALD, PVD, MBD, PECVD, another suitable deposition process, or a combination thereof. In some embodiments, the hard mask layer 116 may be made of a nitride or an oxide formed by tetraethoxysilane (TEOS).

A photoresist material is formed on a top surface of the hard mask 116 by a suitable process such as spin coating, CVD, ALD, PVD, MBD, PECVD, another suitable deposition process, or a combination thereof. Then, an optical exposure, a post-exposure baking and a development are performed to remove a part of the photoresist material to form a patterned photoresist layer. The patterned photoresist layer will serve as an etching mask for the etching process. The photoresist layer may be a bi-layer or tri-layer photoresist layer. Then, the oxygen exchange layer 114 and the hard mask 116 are etched by any acceptable etching process, such as reactive ion etching, neutral beam etching, or a combination thereof, in order to form a patterned oxygen exchange layer 114 and a patterned hard mask 116 corresponding to the conductive structure 105. Hereafter, the patterned photoresist layer may be removed by etching or other suitable methods.

The patterned oxygen exchange layer 114 does not completely cover the resistance switching layer 112. That is, the patterned oxygen exchange layer 114 covers a part of the resistance switching layer 112. In other words, a contact area between the patterned oxygen exchange layer 114 and the resistance switching layer 112 is smaller than the top surface area of the resistance switching layer 112. Since the oxygen exchange layer 114 does not completely cover the top surface of the resistance switching layer 112, when the memory changes from a high resistance state to a low resistance state, oxygen atoms in a certain region of the resistance switching layer 112 will move into the oxygen exchange layer. Since the certain region of the resistance switching layer 112 corresponds to the contact area between the patterned oxygen exchange layer 114 and the resistance switching layer 112, oxygen atoms in the resistance switching layer 112 below the contact area will move into the oxygen exchange layer 114. And a conductive filament is formed in the certain region. That is, the conductive filament is formed in the region corresponding to the contact area between the patterned oxygen exchange layer 114 and the resistance switching layer 112, and the conductive filament is passing through the contact area between the patterned oxygen exchange layer 114 and the resistance switching layer 112. Therefore, when the memory is switched from the low resistance state to the high resistance state, the oxygen atoms are more easily to backfill into oxygen vacancies generated in the resistance switching layer at the low resistance state, thereby increasing the device stability.

The resistance switching layer 112 has a left sidewall and a right sidewall opposite to the left sidewall. In some embodiments, the oxygen exchange layer 114 is located between the left sidewall and the right sidewall. Specifically, the oxygen exchange layer 114 is not aligned with the left sidewall and the right sidewall of the resistance switching layer 112. That is, the oxygen exchange layer 114 of the present disclosure is located between the two sidewalls of the resistance switching layer 112. The oxygen exchange layer 114 of the present disclosure is spaced by a distance with the left sidewall of the resistance switching layer 112 and also spaced by a distance with the right sidewall of the resistance switching layer 112. However, an oxygen exchange layer of an ordinary resistive random access memory is generally aligned with the left sidewall and the right sidewall of the resistance switching layer. In other words, the oxygen exchange layer of the ordinary resistive random access memory is not located between the two sidewalls of the resistance switching layer, and the sidewalls of the resistance switching layer are easily affected by subsequent processes. Thus, during a transition from the low resistance state to the high resistance state, a part of the oxygen atoms will move from the oxygen exchange layer to the sidewall of the resistance switching layer to generate dangling bonds, reducing an efficiency of exchanging oxygen atoms. Therefore, when the oxygen exchange layer is located between the left sidewall and the right sidewall, the oxygen atoms in the oxygen exchange layer will not move into the sidewall of the resistance switching layer, thus the dangling bonds will not be generated. Thereby, the efficiency of exchanging oxygen atoms is increase.

Still referring to FIG. 1, a dielectric layer 118 is formed on the resistance switching layer 112. Methods of forming the dielectric layer 118 may include CVD, ALD, PVD, MBD, PECVD, other suitable deposition processes, or combinations thereof. In some embodiments, dielectric layer 118 is made of a similar material as dielectric layer 104.

Figure 2:
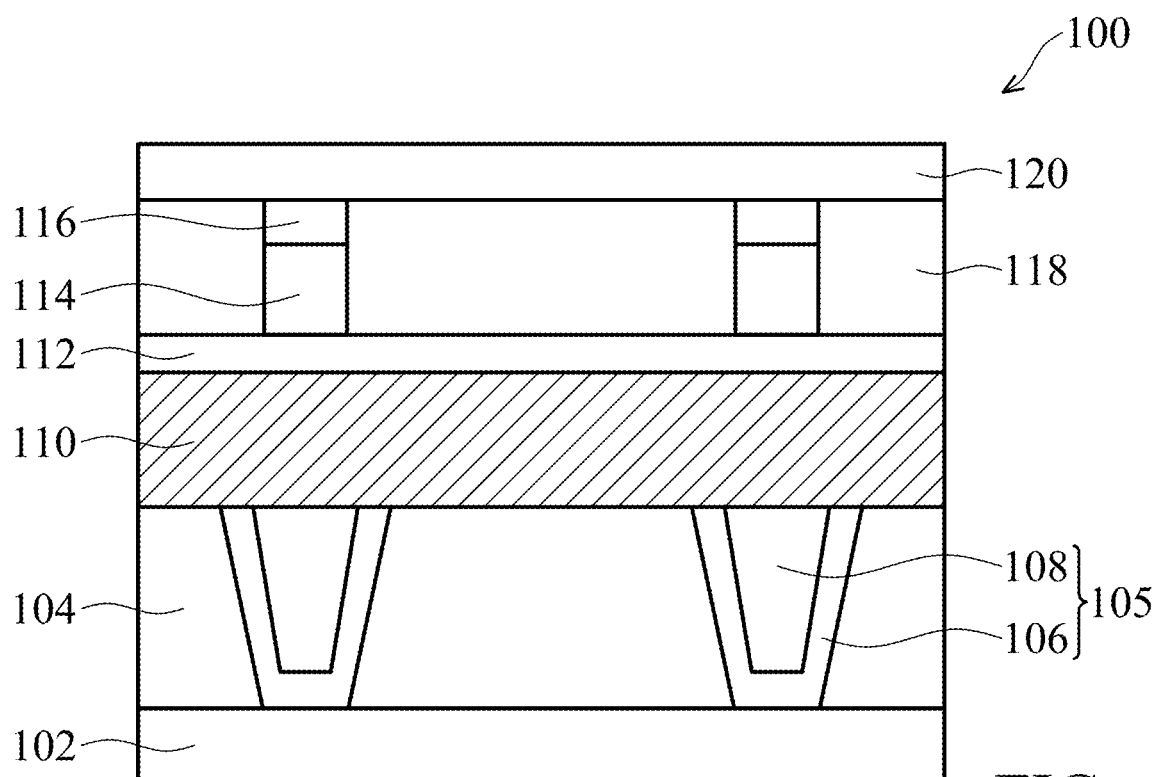

Referring to FIG. 2, part of the dielectric layer 118 and the hard mask 116 are removed by a planarization process such as chemical mechanical polishing. Then, a nitride layer 120 is formed on the dielectric layer 118 and the hard mask 116. Methods of forming the nitride layer 120 may include CVD, ALD, PVD, MBD, PECVD, other suitable deposition processes, or combinations thereof. In some embodiments, the nitride layer 120 is made of silicon nitride, silicon carbon nitride, silicon carbide, or a combination thereof.

Figure 3:
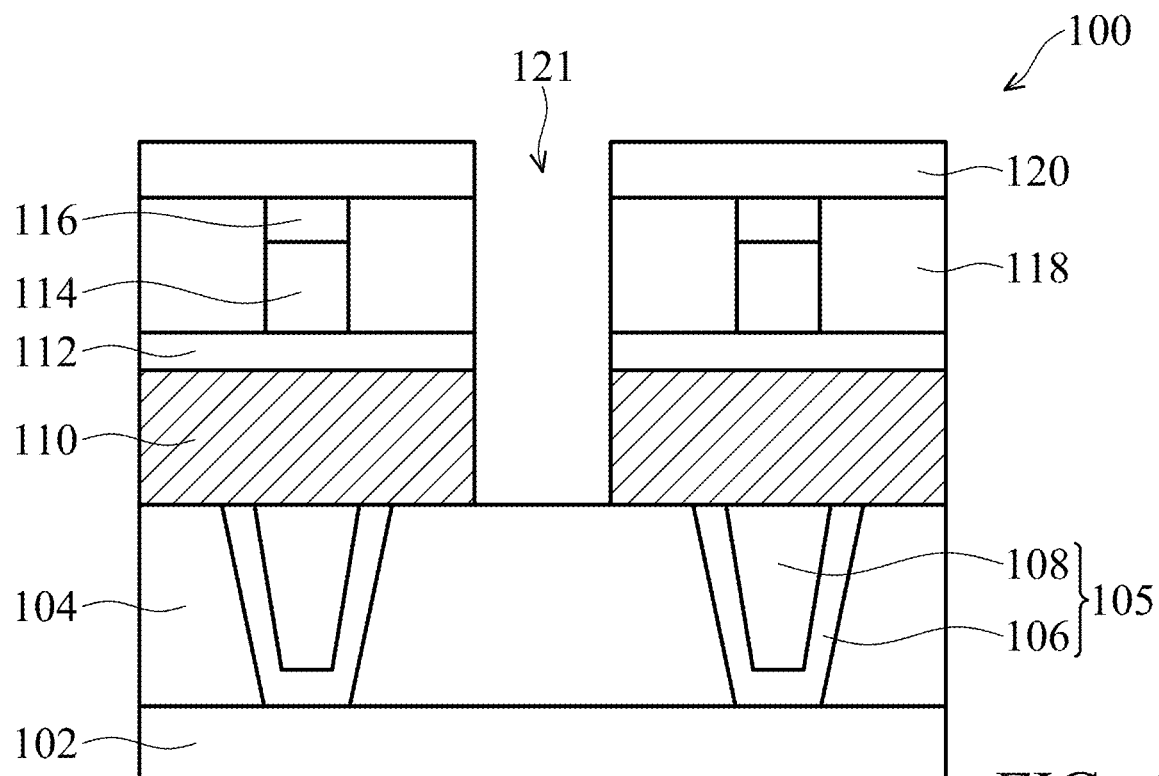

Next, referring to FIG. 3, photoresist material is formed on the top surface of the nitride layer 120 using a suitable process such as spin coating, CVD, ALD, PVD, MBD, PECVD, another suitable deposition process, or a combination thereof. Then, an optical exposure, a post-exposure baking and development are performed to remove part of the photoresist material to form a patterned photoresist layer. The patterned photoresist layer will serve as an etching mask for the etching process. The photoresist layer may be a bi-layer or tri-layer photoresist layer. Then, the nitride 120, the dielectric layer 118, the resistance switching layer 112 and the bottom electrode 110 are etched by any acceptable etching process, such as reactive ion etching, neutral beam etching, or a combination thereof, in order to form a trench 21 for defining individual memory cells 10 (shown in FIG. 6). Then, the patterned photoresist layer may be removed by etching or other suitable methods.

Since the resistance switching layer and the oxygen exchange layer are etched in different processes, the sidewalls of the oxygen exchange layer can be prevented from being damaged.

Figure 4:
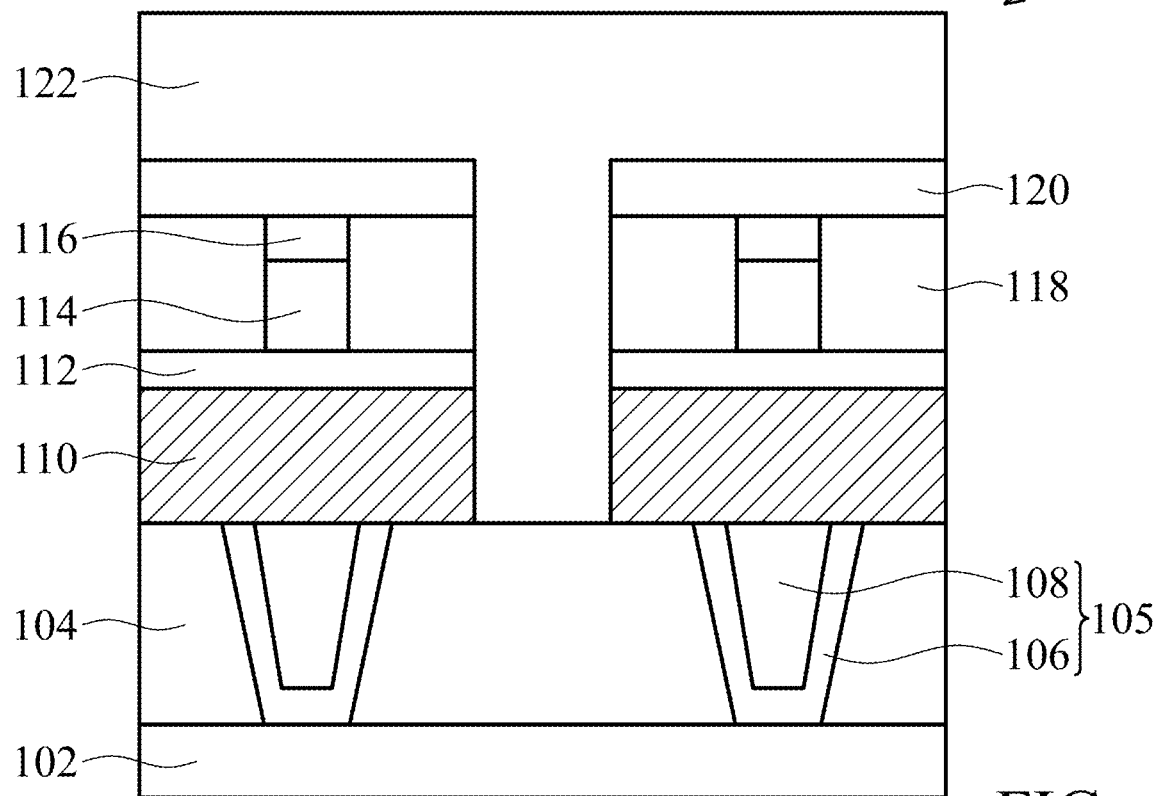

Next, referring to FIG. 4, a dielectric layer 122 is formed in the trench 121 and on the nitride layer 120 by CVD, ALD, PVD, MBD, PECVD, another suitable deposition process, or a combination thereof. In some embodiments, dielectric layer 122 is made of a similar material as dielectric layer 104.

Figure 5:
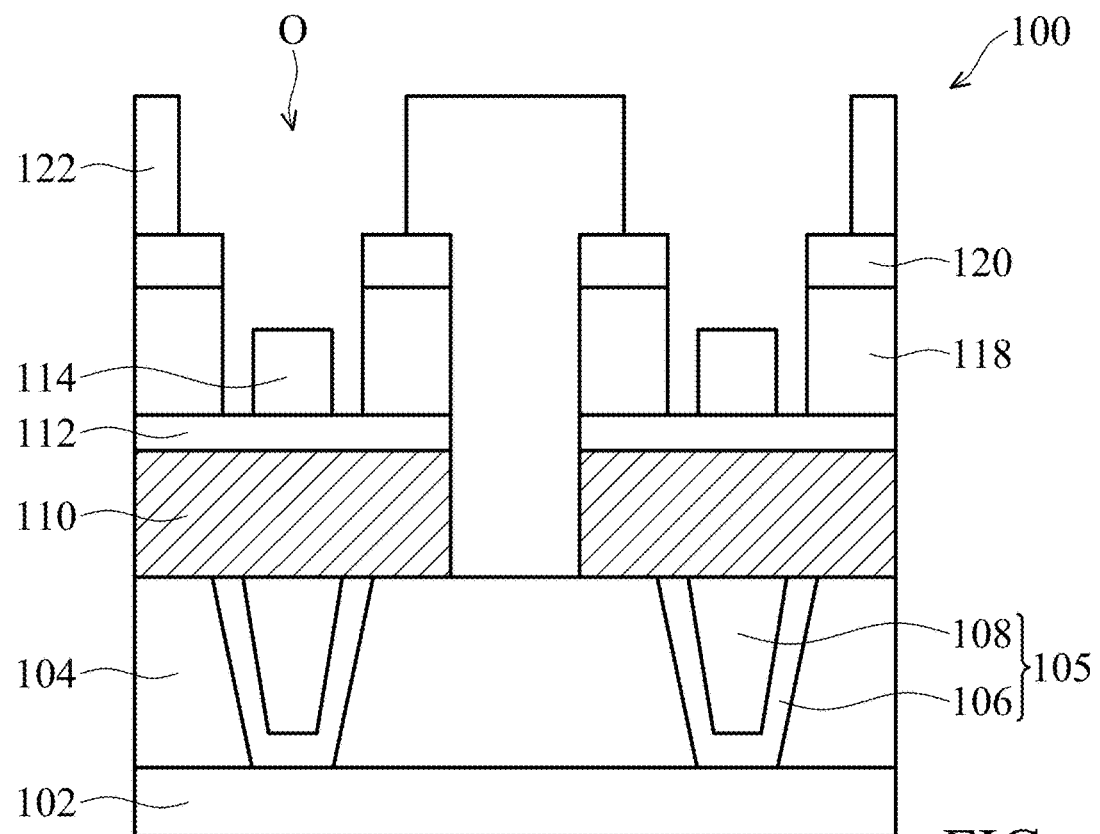

Referring to FIG. 5, the dielectric layer 122, the nitride layer 120, and the dielectric layer 118 are etched by a process that is similar to the one mentioned above to form an opening O exposing the oxygen exchange layer 114. In some embodiments, the dielectric layer 122, the nitride layer 120, and the dielectric layer 118 may be etched in the same process. In another embodiment, the dielectric layer 122, the nitride layer 120, and the dielectric layer 118 may be etched in different processes.

Figure 6:
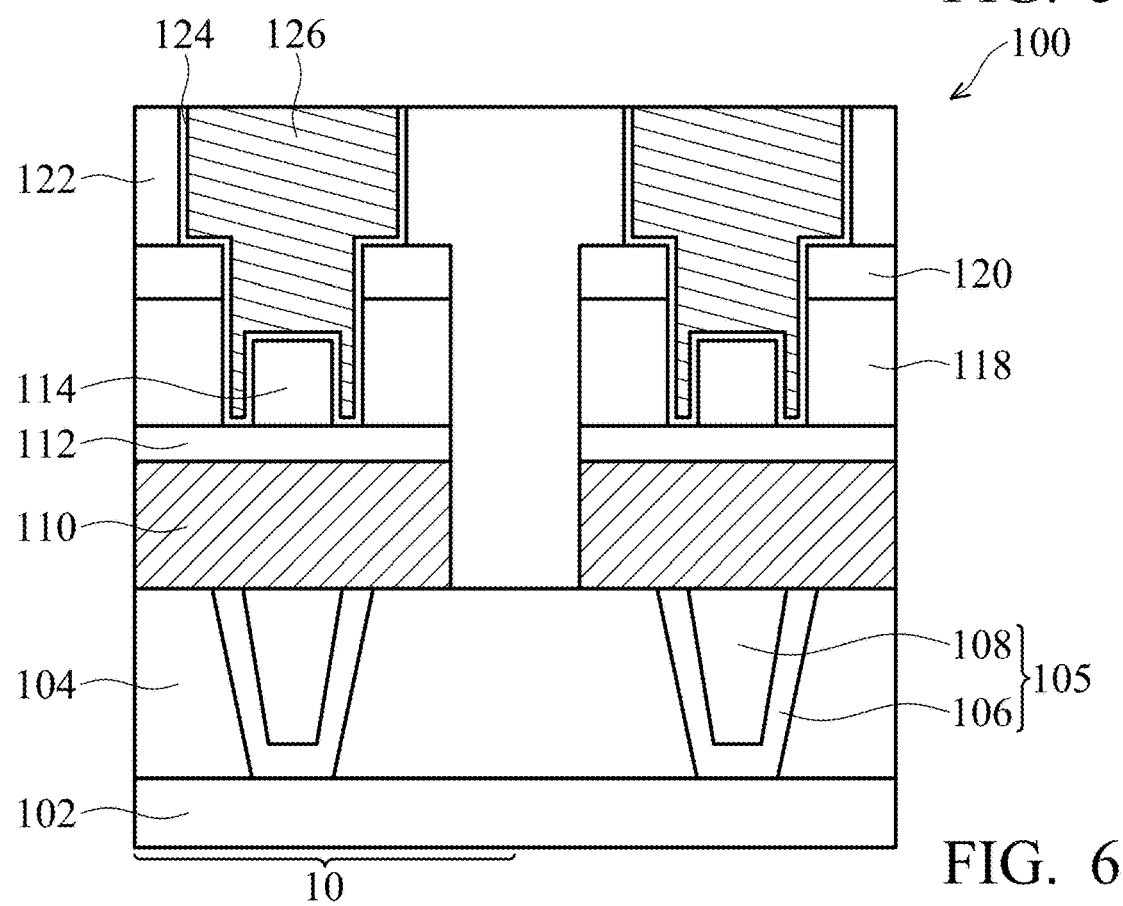

Referring to FIG. 6, a barrier layer 124 is conformably formed in the opening O. Methods of forming the barrier layer 124 may include CVD, ALD, PVD, MBD, PECVD, other suitable deposition processes, or combinations thereof. The barrier layer 124 can prevent oxygen atoms from diffusing into other unnecessary layers. In some embodiments, the barrier layer 124 is made of aluminum oxide, hafnium oxide, zirconium oxide, or a combination thereof.

Then, a top electrode 126 is formed on the barrier layer 124. Methods of forming the top electrode 126 may include CVD, ALD, PVD, MBD, PECVD, other suitable deposition processes, or combinations thereof. In some embodiments, the top electrode 126 is made of a similar material as the bottom electrode 110. Specifically, the top electrode 126 covers the top surface and sidewalls of the oxygen exchange layer 114. Since the top electrode covers the top surface and the sidewalls of the oxygen exchange layer at the same time, when a reverse reset voltage is applied to the resistive random access memory, the oxygen atoms in the oxygen exchange layer will be promoted to move into a certain direction, thereby increasing the efficiency of exchanging oxygen atoms. The top electrode 126 has a self-aligning function through forming the opening O.

A part of the top electrode 126 extends on the nitride layer 120. Since the nitride layer 120 is between the dielectric layer 118 and a part of the top electrode 126, a shape of the opening O may be easily controlled, thereby increasing a process window.

The top electrode 126 has an upper portion and a lower portion, wherein the upper portion of the top electrode 126 is on the nitride layer 120; and the lower portion of the top electrode 126 is under the nitride layer 120. The upper part of the top electrode 126 serves as a wire electrically connecting to other elements. Then, a planarization process is performed to make the top surfaces of the dielectric layer 122, the barrier layer 124, and the top electrode 126 coplanar.

The resistive random access memory and method of manufacturing the same of the present disclosure have the following advantages: (1) Since the top electrode covers the top surface and sidewalls of the oxygen exchange layer at the same time, when the reverse reset voltage is applied to the resistive random access memory, the oxygen atoms in the oxygen exchange layer are promoted to move in a certain direction, thereby increasing the efficiency of exchanging oxygen atom. (2) Since the oxygen exchange layer not completely covers the top surface of the resistance switching layer, when the memory switches from the high resistance state to the low resistance state, oxygen atoms in a certain area in the resistance switching layer will move into oxygen exchange layer, and the conductive switched from the low resistance state to the high resistance state. The oxygen atoms are more easily to backfill into the oxygen vacancies generated in the resistance switching layer at the low resistance state, thereby increasing the device stability. (3) Since the oxygen exchange layer is located between the left sidewall and the right sidewall, the oxygen atoms in the oxygen exchange layer will not move to the sidewall of the resistance switching layer. Thus, the dangling bonds will not be generated. Thereby, the efficiency of exchanging oxygen atoms is increase. (4) Since the resistance switching layer and the oxygen exchange layer are etched in different processes, the sidewalls of the oxygen exchange layer can be prevented from being damaged. (5) Since the nitride layer is between the dielectric layer and a part of the top electrode, a shape of the opening is easily controlled, thereby increasing the process window.

Although the embodiments of the present disclosure and its advantages have been described above, it should be understood that a person of ordinary skill in the art can make changes, substitutions, and modifies without departing from

What is claimed is:

1. A resistive random access memory, comprising:
a substrate;
a first dielectric layer disposed on the substrate;
a bottom electrode disposed on the first dielectric layer;
a resistance switching layer disposed on the bottom electrode;
an oxygen exchange layer disposed on the resistance switching layer, wherein a contact area between the oxygen exchange layer and the resistance switching layer is smaller than a top surface area of the resistance switching layer;
a barrier layer disposed on the oxygen exchange layer; and
a top electrode disposed on the barrier layer,
wherein the top electrode covers a sidewall of the oxygen exchange layer.

2. The resistive random access memory as claimed in claim 1, wherein the resistance switching layer has a left sidewall and a right sidewall opposite to the left sidewall, and the oxygen exchange layer is located between the left sidewall and the right sidewall.

3. The resistive random access memory as claimed in claim 2, wherein the oxygen exchange layer is not aligned with the left sidewall and the right sidewall.

4. The resistive random access memory as claimed in claim 1, wherein the barrier layer covers the sidewall of the oxygen exchange layer.

5. The resistive random access memory as claimed in claim 1, further comprising:
a second dielectric layer disposed on the resistance switching layer; and
a nitride layer disposed on the second dielectric layer.

6. The resistive random access memory as claimed in claim 5, wherein the oxygen exchange layer is below an opening of the second dielectric layer and the nitride layer.

7. The resistive random access memory as claimed in claim 5, wherein the top electrode extends on the nitride layer.

8. A method for manufacturing a resistive random access memory, comprising:
providing a substrate;
forming a first dielectric layer on the substrate;
forming a bottom electrode on the first dielectric layer;
forming a resistance switching layer on the bottom electrode;
forming an oxygen exchange layer on the resistance switching layer, wherein a contact area between the oxygen exchange layer and the resistance switching layer is smaller than a top surface area of the resistance switching layer;
forming a barrier layer on the oxygen exchange layer; and
forming a top electrode on the barrier layer,
wherein the top electrode covers a sidewall of the oxygen exchange layer.

9. The method as claimed in claim 8, wherein the resistance switching layer has a left sidewall and a right sidewall opposite to the left sidewall, and the oxygen exchange layer is located between the left sidewall and the right sidewall.

10. The method as claimed in claim 9, wherein the oxygen exchange layer is not aligned with the left sidewall and the right sidewall.

11. The method as claimed in claim 8, wherein the barrier layer covers the sidewall of the oxygen exchange layer.

12. The method as claimed in claim 8, further comprising:
forming a second dielectric layer on the resistance switching layer; and
forming a nitride layer on the second dielectric layer.

13. The method as claimed in claim 12, wherein the second dielectric layer and the nitride layer have an opening exposing the oxygen exchange layer.

14. The method as claimed in claim 12, wherein the top electrode extends on the nitride layer.

* * * * *